(12) United States Patent
Takeuchi

(10) Patent No.: US 8,362,784 B2
(45) Date of Patent: Jan. 29, 2013

(54) CAPACITOR CAPACITANCE DIAGNOSIS DEVICE AND ELECTRIC POWER APPARATUS EQUIPPED WITH CAPACITOR CAPACITANCE DIAGNOSIS DEVICE

(75) Inventor: Yasushi Takeuchi, Chiyoda-ku (JP)

(73) Assignee: Mitsubishi Electric Corporation, Chiyoda-Ku, Tokyo (JP)

( * ) Notice: Subject to any disclaimer, the term of this patent is extended or adjusted under 35 U.S.C. 154(b) by 524 days.

(21) Appl. No.: 12/638,057

(22) Filed: Dec. 15, 2009

(65) Prior Publication Data

US 2010/0321040 A1   Dec. 23, 2010

(30) Foreign Application Priority Data

Jun. 22, 2009 (JP) ................................ 2009-147667

(51) Int. Cl.
 *G01R 31/12* (2006.01)
(52) U.S. Cl. ........ 324/548; 324/509; 324/544; 324/557; 324/551; 324/659; 324/678
(58) Field of Classification Search .................. 324/548, 324/509, 544, 557, 551, 659, 678
See application file for complete search history.

(56) References Cited

U.S. PATENT DOCUMENTS

| | | | | |
|---|---|---|---|---|
| 3,007,112 | A * | 10/1961 | Taylor | 324/111 |
| 5,329,239 | A * | 7/1994 | Kindermann et al. | 324/678 |
| 5,703,412 | A * | 12/1997 | Takemoto et al. | 307/10.1 |
| 6,191,723 | B1 * | 2/2001 | Lewis | 341/166 |
| 6,275,047 | B1 * | 8/2001 | Zoellick et al. | 324/678 |
| 6,326,792 | B1 * | 12/2001 | Okada | 324/456 |
| 6,472,859 | B1 * | 10/2002 | Tippy et al. | 324/76.11 |
| 6,731,129 | B1 * | 5/2004 | Belluomini et al. | 324/678 |
| 7,148,697 | B2 * | 12/2006 | Doljack | 324/548 |
| 7,173,438 | B2 * | 2/2007 | Pooranakaran et al. | 324/678 |
| 7,215,127 | B1 * | 5/2007 | Lu et al. | 324/548 |
| 7,292,048 | B2 * | 11/2007 | Borsi et al. | 324/632 |
| 7,307,485 | B1 * | 12/2007 | Snyder et al. | 331/150 |
| 7,327,132 | B2 * | 2/2008 | Armentrout et al. | 324/71.1 |

(Continued)

FOREIGN PATENT DOCUMENTS

| | | |
|---|---|---|
| CN | 1790572 A | 6/2006 |
| JP | 62-238471 | 10/1987 |

(Continued)

OTHER PUBLICATIONS

Office Action from Chinese Patent Office dated Aug. 28, 2012, issued in corresponding Chinese Patent Application No. 2009102668331, with English translation thereof.

(Continued)

*Primary Examiner* — Patrick Assouad
*Assistant Examiner* — Lamarr Brown
(74) *Attorney, Agent, or Firm* — Buchanan Ingersoll & Rooney PC

(57) ABSTRACT

A capacitor capacitance diagnosis device includes a power supply which is for charging a capacitor, a discharge circuit which is connected to the capacitor in parallel to discharge energy of the capacitor, a resistance dividing circuit which is for measuring voltage drop value during discharging, a measurement circuit which measures divided voltage, and a diagnosis circuit which determines adequacy of capacitor capacitance from a time change in voltage due to the discharge. This makes it possible to diagnose adequacy of capacitor capacitance of an electric power apparatus during operation.

6 Claims, 3 Drawing Sheets

U.S. PATENT DOCUMENTS

| | | | | |
|---|---|---|---|---|
| 7,479,791 B2* | 1/2009 | Kraus | | 324/678 |
| 7,521,941 B2* | 4/2009 | Ely et al. | | 324/678 |
| 7,609,076 B2* | 10/2009 | Nakaie et al. | | 324/713 |
| 7,663,382 B2* | 2/2010 | Corulli et al. | | 324/713 |
| 7,800,872 B2* | 9/2010 | Arioka et al. | | 361/28 |
| 7,804,307 B1* | 9/2010 | Bokma et al. | | 324/663 |
| 7,825,670 B2* | 11/2010 | Nie et al. | | 324/678 |
| 7,830,759 B2* | 11/2010 | Horiguchi | | 369/44.32 |
| 8,089,289 B1* | 1/2012 | Kremin et al. | | 324/678 |
| 8,289,034 B2* | 10/2012 | Kuang | | 324/676 |
| 2001/0050561 A1* | 12/2001 | Rundkvist | | 324/678 |
| 2002/0140438 A1* | 10/2002 | Lund et al. | | 324/678 |
| 2003/0098695 A1* | 5/2003 | Hsieh et al. | | 324/548 |
| 2005/0035771 A1* | 2/2005 | Yakabe et al. | | 324/658 |
| 2005/0040840 A1* | 2/2005 | Kang et al. | | 324/765 |
| 2005/0068045 A1* | 3/2005 | Inaba et al. | | 324/678 |
| 2005/0099188 A1* | 5/2005 | Baxter | | 324/678 |
| 2005/0104604 A1* | 5/2005 | Mellert et al. | | 324/678 |
| 2005/0218913 A1* | 10/2005 | Inaba et al. | | 324/678 |
| 2007/0176609 A1* | 8/2007 | Ely et al. | | 324/678 |
| 2007/0216425 A1* | 9/2007 | Okamura et al. | | 324/678 |
| 2007/0222427 A1* | 9/2007 | Takeuchi et al. | | 324/71.2 |
| 2008/0042660 A1* | 2/2008 | Ely et al. | | 324/678 |
| 2008/0100283 A1* | 5/2008 | Cheung et al. | | 324/158.1 |
| 2008/0200748 A1* | 8/2008 | Testani et al. | | 600/13 |
| 2009/0174416 A1* | 7/2009 | Ely et al. | | 324/678 |
| 2009/0237088 A1* | 9/2009 | Nonaka et al. | | 324/548 |
| 2009/0267714 A1* | 10/2009 | Arioka et al. | | 335/68 |
| 2010/0171511 A1* | 7/2010 | Horikoshi et al. | | 324/551 |
| 2010/0194406 A1* | 8/2010 | Corulli et al. | | 324/659 |
| 2010/0244858 A1* | 9/2010 | Cormier, Jr. | | 324/678 |
| 2010/0308841 A1* | 12/2010 | Karrer et al. | | 324/551 |
| 2011/0006781 A1* | 1/2011 | Kawamura | | 324/551 |
| 2011/0012606 A1* | 1/2011 | Kawamura | | 324/509 |
| 2011/0062962 A1* | 3/2011 | Wolf et al. | | 324/548 |
| 2011/0084705 A1* | 4/2011 | Kawamura | | 324/551 |
| 2011/0133757 A1* | 6/2011 | Chae et al. | | 324/678 |
| 2011/0273192 A1* | 11/2011 | Huang et al. | | 324/678 |
| 2012/0025840 A1* | 2/2012 | Kim et al. | | 324/509 |
| 2012/0153964 A1* | 6/2012 | Chen et al. | | 324/547 |
| 2012/0153966 A1* | 6/2012 | Kawamura | | 324/548 |
| 2012/0206148 A1* | 8/2012 | Schaefer | | 324/509 |
| 2012/0206152 A1* | 8/2012 | Naruse et al. | | 324/557 |

FOREIGN PATENT DOCUMENTS

| | | |
|---|---|---|
| JP | 63-193368 U | 12/1988 |
| JP | 6-207959 A | 7/1994 |
| JP | 9-229976 A | 9/1997 |
| JP | 2000131358 A | 5/2000 |
| JP | 2002-281735 | 9/2002 |
| JP | 2003-028916 | 1/2003 |
| JP | 2007-202298 | 8/2007 |

OTHER PUBLICATIONS

Office Action from Korean Patent Office dated Sep. 27, 2012, issued in corresponding Korean Patent Application No. 10-2011-7024268, with English translation thereof.

* cited by examiner

CAPACITOR CAPACITANCE DIAGNOSIS DEVICE AND ELECTRIC POWER APPARATUS EQUIPPED WITH CAPACITOR CAPACITANCE DIAGNOSIS DEVICE

BACKGROUND OF THE INVENTION

1. Field of the Invention

The present invention relates to a capacitor capacitance diagnosis device which determines adequacy of capacitor capacitance, and to an electric power apparatus which includes the capacitor capacitance diagnosis device and has an electromagnetic operating mechanism that is operative when an electromagnetic coil is energized by energy accumulated in a capacitor.

2. Description of the Related Art

An electric power apparatus for use in an electrical feeder system is required to ensure reliability over a long period. Therefore, periodic diagnosis of the apparatus is indispensable. For example, in an encapsulated composite insulation switchgear, opening and closing operation of a vacuum circuit breaker is performed by an electromagnetic operating mechanism by means of an electromagnetic coil, and energy accumulated in a capacitor is used to open a contact. A large capacity electrolytic capacitor necessary for operating an electric power apparatus is regarded as a limited lifetime component; and therefore, degradation in capacitor capacitance due to aged deterioration is concerned. Consequently, in order to ensure reliability of a vacuum circuit breaker, the followings are required: the capacitor is periodically removed, capacitance is checked, capacitor capacitance diagnosis for determining adequacy of the capacitor is carried out, and replacement of the capacitor is carried out in the case where deterioration or the like is recognized. However, checking of the capacitor other than time of periodic inspection makes the electric power apparatus stop, and the number of diagnoses is limited. If a diagnosis device can determine adequacy of capacitor capacitance during operation of the electric power apparatus without detaching, the number of diagnosis frequencies can be considerably increased without stopping the apparatus and an improvement in reliability is expected.

In a known capacitor capacitance diagnosis circuit of a backup capacitor for use in an air bag of a passive safety device for vehicles, a discharge circuit composed of a resistor and a switching circuit connected in series are connected to a capacitor in parallel; the switching circuit of the discharge circuit is kept in an ON state for a certain time; a ratio between a charging voltage value V1 of the capacitor just before the ON state and a terminal voltage change value (V1-V2) of the capacitor due to discharge for the certain time is calculated; its calculation result is compared with a reference value; and accordingly, adequacy of capacitor capacitance is diagnosed. This actualizes assured and accurate diagnosis without being influenced by variation in output voltage of a DC power supply connected to the capacitor. Incidentally, the diagnosis of the capacitor is carried out at starting of a vehicle (for example, see Japanese Unexamined Patent Publication No. H9-229976).

In addition, in other known capacitor capacitance diagnosis device of a backup capacitor for use in an air bag of a passive safety device for vehicles, a voltage value across a capacitor is compared with a threshold to diagnose abnormality of the capacitor. The capacitor capacitance diagnosis device includes a detection unit which detects a threshold and a voltage value across the capacitor (initial value) in starting charging, and a unit which diagnoses abnormality of the capacitor by variably setting the threshold to not less than the initial value on the basis of the initial value and by comparing this variably set threshold with a voltage value across the capacitor after starting charging. This actualizes assured diagnosis of the abnormality of the capacitor even when an electric charge is already present at a time of starting charging. Incidentally, the diagnosis of the capacitor is carried out before running (for example, see Japanese Unexamined Patent Publication No. H6-207959).

However, in the known capacitor capacitance diagnosis circuit and capacitor abnormality diagnosis device, both have the objective of diagnosing the backup capacitor of the air bag for vehicles and the diagnosis is carried out only at starting of a vehicle just after inputting an ignition switch, and regular diagnosis during driving is not assumed. Once operation is started, the operation is used in the longer term; and therefore, there is a problem in that this application cannot be used for capacitor capacitance diagnosis for use in an electromagnetic operating mechanism of an electric power apparatus which needs periodic diagnosis of capacitor capacitance during the operation.

SUMMARY OF THE INVENTION

An object of the present invention is to solve the foregoing problem and to provide a capacitor capacitance diagnosis device and an electric power apparatus equipped with the capacitor capacitance diagnosis device, both of which are capable of periodically diagnosing a capacitor without causing a problem for driving by means of the capacitor for use in an electromagnetic operating mechanism of the electric power apparatus during operation.

According to the present invention, there is provided a capacitor capacitance diagnosis device including: a power supply which charges a capacitor; a discharge circuit which is composed of a discharge resistor and a discharge switch connected in series, and is connected to the capacitor in parallel; a resistance dividing circuit which is composed of a first resistor and a second resistor connected in series, and is connected to the capacitor in parallel; a measurement circuit which measures by amplifying a voltage at a dividing point between the first resistor and the second resistor; and a diagnosis circuit which stops charging of the capacitor, discharges energy charged in the capacitor for a predetermined time by electrically conducting the discharge switch of the discharge circuit, and determines adequacy of capacitor capacitance from a voltage drop value due to the discharge, the voltage drop value being measured by the measurement circuit. The voltage drop value during diagnosis due to the discharge of the charged capacitor is limited to within a predetermined value.

According to the capacitor capacitance diagnosis device of the present invention, voltage drop due to discharge of the capacitor is set to within a predetermined value during diagnosis of capacitor capacitance; and accordingly, diagnosis can be performed during operation of the capacitor.

Furthermore, according to the present invention, there is provided an electric power apparatus including: the capacitor capacitance diagnosis device; and an electromagnetic operating mechanism operated by energy charged in the capacitor.

According to the electric power apparatus equipped with the capacitor capacitance diagnosis device of the present invention, the application is used for capacitor capacitance diagnosis for use in the electromagnetic operating mechanism of the electric power apparatus, whereby capacitor capacitance diagnosis can be performed during operation of the electric power apparatus.

The foregoing and other objects, features, aspects and advantages of the present invention will become more apparent from the following detailed description of the present invention when taken in conjunction with the accompanying drawings.

DETAILED DESCRIPTION OF THE INVENTION

Preferred Embodiment 1

Figure 1:
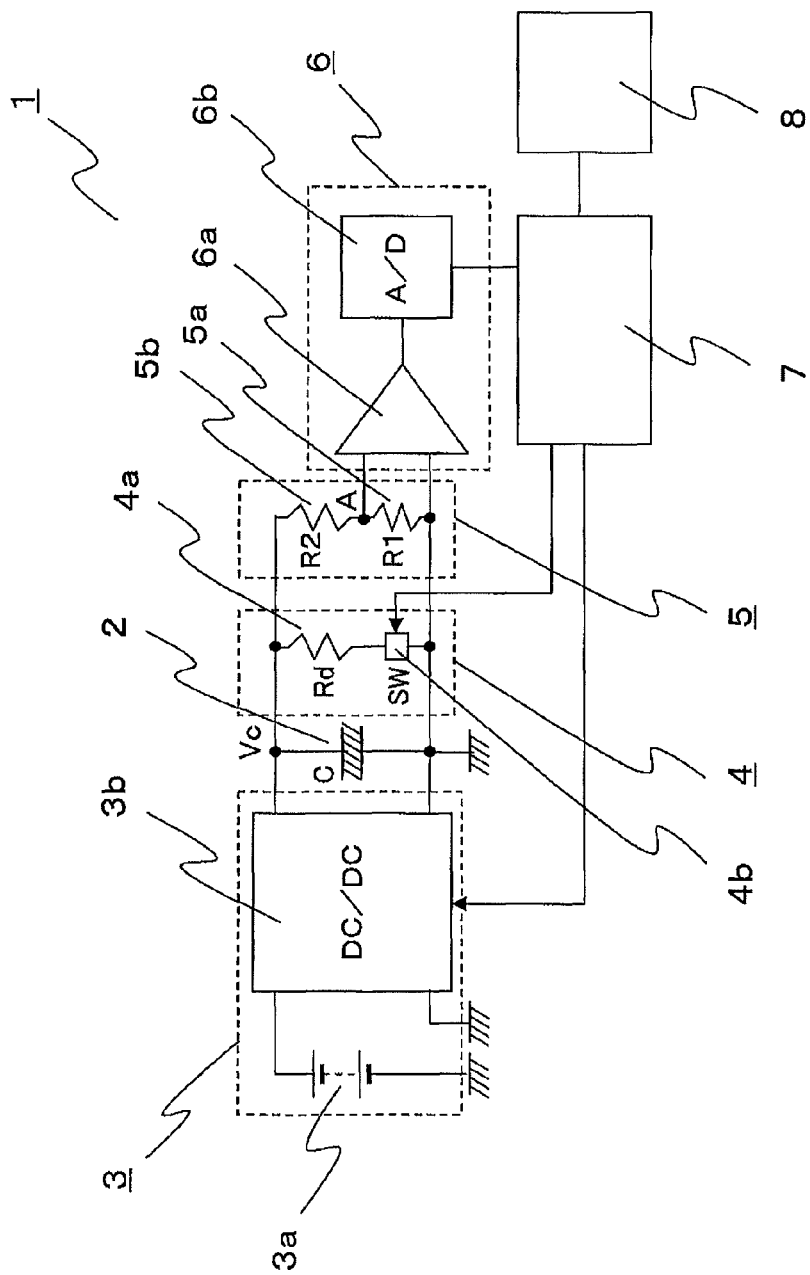
FIG. 1 is a circuit configuration diagram showing an outline of a capacitor capacitance diagnosis device in a preferred embodiment 1 of the present invention.
Figure 2:
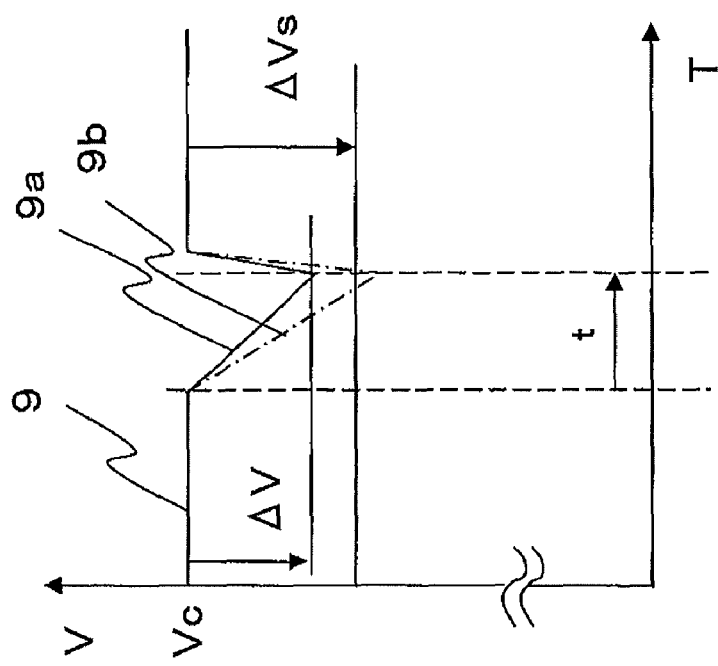
FIG. 2 is an explanation view showing a change in voltage due to discharge of the capacitor capacitance diagnosis device in the preferred embodiment 1 of the present invention.

FIG. 1 is a circuit configuration diagram showing an outline of a capacitor capacitance diagnosis device in a preferred embodiment 1 of the present invention. FIG. 2 is an explanation view showing a change in capacitor voltage due to discharge of the capacitor capacitance diagnosis device.

As shown in FIG. 1, a capacitor capacitance diagnosis device 1 includes a power supply 3 composed of a DC power supply 3a which is for charging a capacitor 2 whose adequacy of capacitance is to be determined and a DC/DC converter 3b which adjusts to a voltage necessary for the capacitor 2; a discharge circuit 4 which is composed of a discharge resistor 4a and a transistor serving as a discharge switch 4b, and is connected to the capacitor 2 in parallel for discharging energy of the capacitor 2; a resistance dividing circuit 5 which is composed of first and second resistors 5a and 5b, and is connected to the capacitor 2 in parallel for measuring voltage drop during discharging; a measurement circuit 6 which is composed of an amplifier 6a and an A/D converter 6b, and is for measuring a voltage at a node A between the first resistor 5a and the second resistor 5b; a diagnosis circuit 7 which gives a stop command for charging the capacitor 2 and a continuity command of the discharge switch 4b of the discharge circuit 4, discharges energy charged in the capacitor 2 for a predetermined time, and determines adequacy of capacitor capacitance from a time change in voltage due to discharge, the time change in voltage being measured by the measurement circuit 6; and an alarm circuit 8 which gives a warning when it is judged to be failed on the basis of judgment results by the diagnosis circuit 7.

Next, the principle of operation of the capacitor capacitance diagnosis device 1 in the preferred embodiment 1 will be described with reference to FIGS. 1 and 2. The capacitor 2 whose adequacy of capacitance is to be determined is supplied electric power from the power supply 3 connected thereto. The capacitor 2 is charged by the DC/DC converter 3b with a voltage Vc which is required by an apparatus to be applied. If charge is completed, the charging stop command is given from the diagnosis circuit 7 to the capacitor 2, and the continuity command of a predetermined time t is given to the discharge switch 4b of the discharge circuit 4. FIG. 2 shows a capacitor voltage 9 due to discharge during diagnosis of capacitor capacitance, a capacitor voltage V reduces with time due to discharge via the discharge resistor 4a after electrically conducting the discharge switch 4b, the voltage drop is stopped at a time t, and the charge is started again. The capacitor voltage V is divided to R1/(R1+R2) at the node A between a resistance R1 of the first resistor 5a and a resistance R2 of the second resistor 5b in the resistance dividing circuit 5, and a voltage drop value ΔV at the time t is measured. The voltage drop value ΔV is converted by the A/D converter 6b via the amplifying circuit 6a, and measurement results by the measurement circuit 6 are sent to the diagnosis circuit 7. In this case, a comparison is made with a reference voltage drop value ΔVs previously set as a predetermined voltage drop value ΔV which is allowable for the capacitor 2 during diagnosis; and in the case of being within the predetermined voltage drop value ΔVs which exceeds a reference value shown by 9a in FIG. 2, the capacitor capacitance is determined to be suitable. In the case of being not less than the voltage drop value ΔVs which exceeds the reference value shown by 9b, the capacitor capacitance is determined to be unsuitable; and when determined to be unsuitable, a warning is given by the alarm circuit 8. In this case, the predetermined voltage drop value ΔVs which is allowable for the capacitor 2 is the voltage drop value ΔV in which capacitance necessary for original operation of the capacitor 2 is ensured even when the capacitor 2 is discharged for a predetermined time for diagnosis. Furthermore, in the known capacitor capacitance diagnosis of the backup capacitor for use in the air bag, a measurement error due to a capacitor's inherent leakage current (self-discharge current) has not been considered. However, measurement is made with a current not less than a capacitor's inherent self-discharge current Is during diagnosis of capacitance; and accordingly, the measurement error is reduced, and accuracy of the capacitance diagnosis can be improved. Consequently, a resistance Rd of the discharge resistor 4 is set so as to fulfill Equation (1):

$$Id = Vc/Rd > Is \qquad (1),$$

where Vc is a voltage of the capacitor during charge and Id is a discharge current.

For example, the discharge current during diagnosis of capacitance is set to 100 times with respect to the self-discharge current; and accordingly, an influence on the measurement error can be considerably reduced to a practically no problem level that is not more than 1%.

The allowable voltage drop value ΔVs during diagnosis to be regarded as suitable for the capacitor capacitance that does not cause a problem on original driving operation of the capacitor is approximately several percent of the charged capacitor voltage Vc. Therefore, the predetermined time t is decided so that a voltage drop value due to discharge of the capacitor to be regarded as suitable during the capacitance diagnosis is within a range of ΔVs. Accordingly, the voltage change value ΔV at the node A in the resistance dividing circuit 5 is small; and therefore, it is desirable that voltage amplification by means of the amplifier 6a is performed.

As described above, in the capacitor capacitance diagnosis device according to the preferred embodiment 1 of the present invention, the measurement is made within the predetermined discharge resistance and time so as to be the voltage drop due to discharge in a range that does not cause a problem on the operation by means of the capacitor during diagnosis of adequacy of the capacitor; and therefore, an advantage which enables original operation of the capacitor can be provided and adequacy of capacitor capacitance can be diagnosed during operation of the capacitor. Furthermore, a discharge current not less than the capacitor's self-discharge current is set to be flown during diagnosis of capacitor capacitance; and accordingly, measurement accuracy of capacitor capacitance can be improved.

Preferred Embodiment 2

Figure 3:
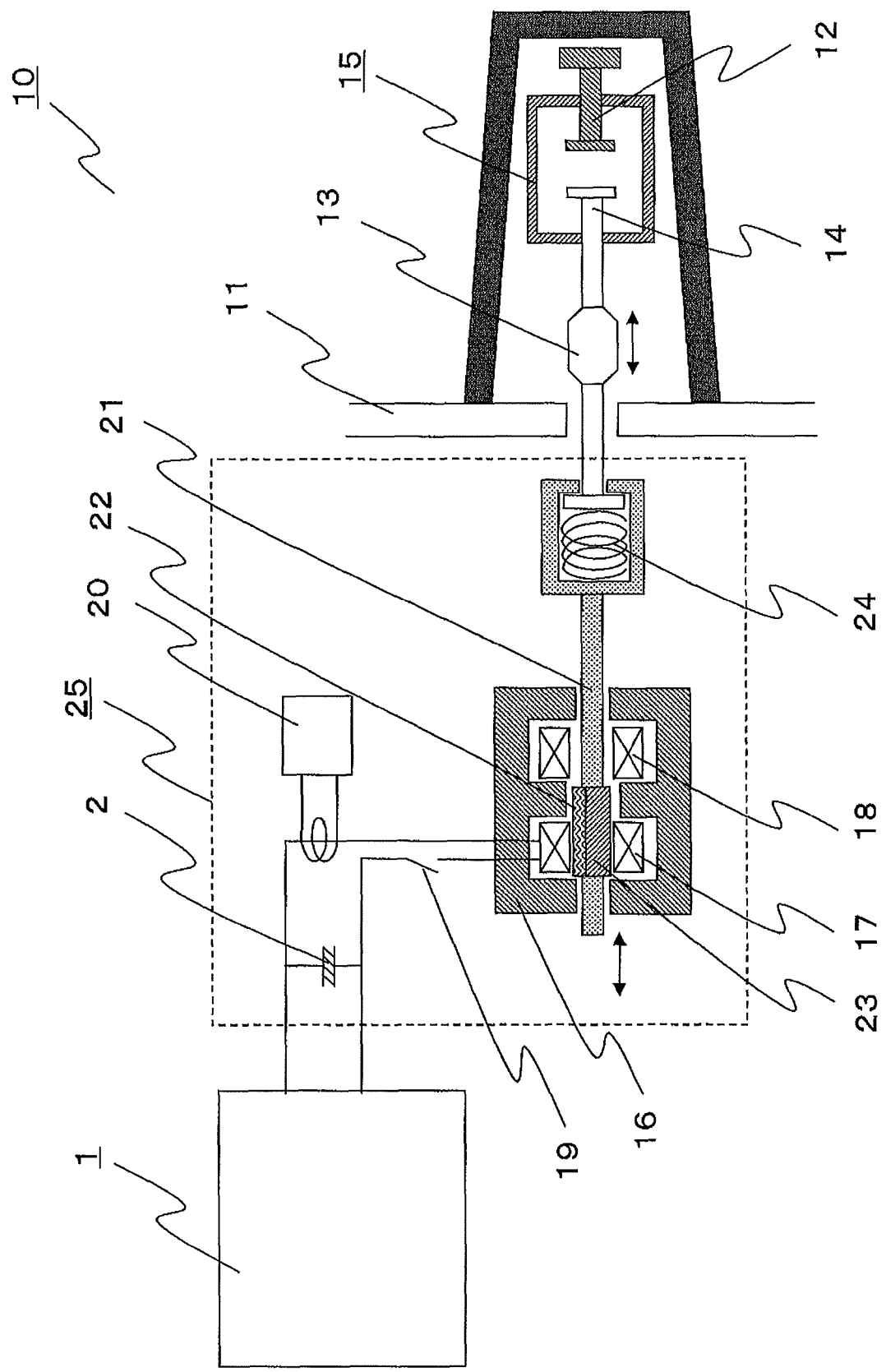
FIG. 3 is a configuration diagram showing an outline of an electric power apparatus equipped with a capacitor capacitance diagnosis device in a preferred embodiment 2 of the present invention.

FIG. 3 is a configuration diagram showing an outline of an electric power apparatus equipped with a capacitor capacitance diagnosis device in a preferred embodiment 2 of the present invention.

In the preferred embodiment 2, as an example of an electric power apparatus having an electromagnetic operating mechanism by means of accumulated energy of a capacitor, description will be made on the case where the capacitor capacitance diagnosis device is applied to a vacuum circuit breaker (VCB). As shown in FIG. 3, a vacuum circuit breaker 10 includes a vacuum switch tube (VST) 15 which is mounted in a tank shielding wall 11, and in which a fixed contact 12 and a movable contact 14 attached to a movable shaft 13 are opened and closed; a fixed core 16 which is mounted outside the tank shielding wall 11; an opening coil 17 and a closing coil 18, both of which are mounted in the fixed core 16; a capacitor 2 which supplies electric power to the opening coil 17; a current transformer (CT) 20 which measures current when the opening coil 17 is energized from the capacitor 2 via a switch 19; a movable shaft 21 which is set so as to pass through the coils 17 and 18; a permanent magnet 22 and a movable core 23, both of which are attached to the movable shaft 21; an electromagnetic operating mechanism 25 which has the function of opening and closing the contacts 12 and 14 of the vacuum switch tube 15 by a contact pressure spring 24 attached to the movable shaft 21; and a capacitor capacitance diagnosis device 1 which diagnoses capacitance of the capacitor 2. The configuration of the capacitor capacitance diagnosis device 1 is the same as that of the preferred embodiment 1; and therefore, description thereof will not be repeated.

Next, the principle of operation of the vacuum circuit breaker in the preferred embodiment 2 will be described with reference to FIG. 3. Opening and closing operation of the vacuum circuit breaker 10 is carried out by electromagnetic force by the electromagnetic coils 17 and 18 of the electromagnetic operating mechanism 25, and opening and closing conditions are maintained by magnetic force of the permanent magnet 22. The opening coil 17 and the closing coil 18 of electromagnetic coils are mounted in the fixed core 16, and the movable shaft 21 to which the movable core 23 and the permanent magnet 22 are attached is set so as to be able to move between the opening coil 17 and the closing coil 18. The movable shaft 21 is connected via the contact pressure spring 24 to the movable shaft 13 on the side of the vacuum switch tube 15 which is connected to the movable contact 14 opposed to the fixed contact 12 of the vacuum switch tube 15. In a closing state of the vacuum switch tube 15, the movable core 23 is suctioned and held by the permanent magnet 22 to the closing side of the fixed core 16. In order to set the vacuum switch tube 15 to be in an opening state, the opening coil 17 is energized from the capacitor 2 by an opening command; and accordingly, the movable core 23 is suctioned to the opening side by magnetic force generated at the opening coil 17. The movable core 23 is also suctioned and held to the opening side by the permanent magnet 22 after stopping energizing to the opening coil 17. This moves the movable shaft 21 to which the movable core 23 is attached, and the contacts of the vacuum switch tube 15 become in the opening state. If the closing coil 18 is energized, the vacuum switch tube 15 becomes a closing state in a reverse operation. The capacitor 2 from which the opening coil 17 is energized is periodically determined about adequacy by the capacitor capacitance diagnosis device 1 and reliability is maintained. The current transformer 20 is used for measuring current supplied from the capacitor 2. The operation of the capacitor capacitance diagnosis device 1 is described in the preferred embodiment 1; and therefore, its description will not be repeated.

In the vacuum circuit breaker 10, the predetermined voltage drop value $\Delta Vs$ due to discharge during diagnosis, which does not cause a problem to electromagnetic operation driving of the capacitor 2, is set to be not more than 1%. For example, in the preferred embodiment 2, diagnosis of adequacy of capacitor capacitance can be carried out at 1 V as the voltage drop value due to discharge for a DC voltage of 77.5 V. Therefore, the predetermined time t is decided so as to be within a range of the voltage drop value $\Delta Vs$ due to discharge necessary for the capacitor capacitance diagnosis, for example, approximately 120 ms. The voltage change value $\Delta V$ at the node A in the resistance dividing circuit 5 is small; and therefore, voltage amplification by the amplifier 6a is required.

As described above, in the vacuum circuit breaker serving as the electric power apparatus equipped with the capacitor capacitance diagnosis device in the preferred embodiment 2 of the present invention, capacitance diagnosis of a driving capacitor can be periodically carried out during operation of the vacuum circuit breaker without removing the capacitor and adequacy of capacitance can be determined; and therefore, longer-term reliability of the electric power apparatus can be improved.

Incidentally, in the above preferred embodiment, the description is made on the case where the capacitance diagnosis is applied to the driving capacitor of the vacuum circuit breaker as the electric power apparatus; however, other electric power apparatus can also be applied as long as an apparatus uses the capacitor as driving energy. Furthermore, an application is made to a capacitor for vehicles such as automobiles, and diagnosis is carried out during operation; and accordingly, reliability can be improved.

While the presently preferred embodiments of the present invention have been shown and described. It is to be understood that these disclosures are for the purpose of illustration and that various changes and modifications may be made without departing from the scope of the invention as set forth in the appended claims.

What is claimed is:

1. A capacitor capacitance diagnosis device comprising:
   a power supply which charges a capacitor;
   a discharge circuit which is composed of a discharge resistor and a discharge switch connected in series, and is connected to the capacitor in parallel;
   a resistance dividing circuit which is composed of a first resistor and a second resistor connected in series, and is connected to the capacitor in parallel;
   a measurement circuit which measures by amplifying a voltage at a dividing point between the first resistor and the second resistor; and
   a diagnosis circuit which stops charging of the capacitor, discharges energy charged in the capacitor for a predetermined time by electrically conducting the discharge switch of the discharge circuit, and determines adequacy of capacitor capacitance from a voltage drop value due to the discharge, the voltage drop value being measured by the measurement circuit, wherein the voltage drop value during diagnosis due to the discharge of the charged capacitor is limited to within a predetermined value.

2. The capacitor capacitance diagnosis device according to claim 1,
wherein the discharge resistor has a resistance value which is set so as to flow a discharge current not less than a self-discharge current in which the capacitor has in discharging.

3. An electric power apparatus comprising: a capacitor capacitance diagnosis device as set forth in claim 1; and
an electromagnetic operating mechanism operated by energy charged in the capacitor.

4. An electric power apparatus comprising:
a capacitor capacitance diagnosis device as set forth in claim 2; and
an electromagnetic operating mechanism operated by energy charged in the capacitor.

5. The electric power apparatus according to claim 3,
wherein, in diagnosis of adequacy of capacitor capacitance, the voltage drop value due to the discharge of the charged capacitor is limited to within a predetermined value in which the electromagnetic operating mechanism is operable.

6. The electric power apparatus according to claim 4,
wherein, in diagnosis of adequacy of capacitor capacitance, the voltage drop value due to the discharge of the charged capacitor is limited to within a predetermined value electromagnetic operating mechanism is operable in which the electromagnetic operating mechanism is operable.

* * * * *